United States Patent
Yu et al.

(10) Patent No.: US 9,884,991 B2
(45) Date of Patent: Feb. 6, 2018

(54) PHOSPHOR, PREPARING METHOD FOR PHOSPHOR, AND LIGHT EMITTING DEVICE

(71) Applicant: Chi Mei Corporation, Tainan (TW)

(72) Inventors: Szu-Chun Yu, Tainan (TW); Jen-Shrong Uen, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 244 days.

(21) Appl. No.: 14/521,550

(22) Filed: Oct. 23, 2014

(65) Prior Publication Data
US 2015/0184071 A1    Jul. 2, 2015

(30) Foreign Application Priority Data
Dec. 26, 2013 (TW) .............................. 102148451 A

(51) Int. Cl.
*C09K 11/77* (2006.01)
*H01L 33/50* (2010.01)

(52) U.S. Cl.
CPC ........ *C09K 11/7769* (2013.01); *H01L 33/502* (2013.01); *H01L 2224/48091* (2013.01); *H01L 2224/8592* (2013.01); *H01L 2924/181* (2013.01); *H01L 2933/0041* (2013.01); *Y10T 428/2982* (2015.01)

(58) Field of Classification Search
CPC ............ C09K 11/0883; C09K 11/7715; C09K 11/7774; C09K 11/7769; C04B 2235/5436; C04B 2235/764; H01L 33/502

USPC ................................... 252/301.4 R; 313/503
See application file for complete search history.

(56) References Cited

U.S. PATENT DOCUMENTS

| 8,377,335 | B2 | 2/2013 | Fukuta et al. |
| 8,414,796 | B2 | 4/2013 | Tao et al. |
| 8,506,104 | B1* | 8/2013 | Murphy ............... H01L 33/502 252/301.4 F |
| 9,133,392 | B2 | 9/2015 | Raukas et al. |
| 2004/0135504 | A1* | 7/2004 | Tamaki ............... C01B 21/0602 313/512 |

(Continued)

FOREIGN PATENT DOCUMENTS

| CN | 101104802 A | 1/2008 |
| CN | 102093891 A | 6/2011 |

(Continued)

OTHER PUBLICATIONS

Machine translation of CN102719235A, printed Aug. 5, 2016, 4 pages.*

(Continued)

*Primary Examiner* — Matthew E Hoban
*Assistant Examiner* — Lynne Edmondson
(74) *Attorney, Agent, or Firm* — McClure, Qualey & Rodack, LLP

(57) ABSTRACT

A phosphor is disclosed, including a formula of $A_{3-a}Ce_aQ_{5-e}E_eO_{12}$. The A, the Q and the E independently comprise elements aluminum (Al), gallium (Ga), indium (In), scandium (Sc), yttrium (Y), lanthanum (La), gadolinium (Gd), terbium (Tb), lutetium (Lu), or a combination thereof. Ce is cerium. O is oxygen. $0 < a \leq 3$. $0 \leq e \leq 5$. A diameter distribution span of the phosphor is less than 0.7.

18 Claims, 1 Drawing Sheet

(56) References Cited

U.S. PATENT DOCUMENTS

| | | |
|---|---|---|
| 2008/0217636 A1 | 9/2008 | Bechtel et al. |
| 2009/0189122 A1* | 7/2009 | Kim .................... C09K 11/574 |
| | | 252/301.36 |
| 2010/0200874 A1 | 8/2010 | Shioi et al. |
| 2011/0305005 A1* | 12/2011 | Tsukatani .......... C09K 11/7774 |
| | | 362/97.3 |
| 2012/0080999 A1 | 4/2012 | Juang et al. |
| 2012/0091879 A1 | 4/2012 | Juang et al. |
| 2013/0134865 A1 | 5/2013 | Chuang et al. |
| 2013/0270992 A1* | 10/2013 | Gleitsmann ............ C09K 11/02 |
| | | 313/483 |

FOREIGN PATENT DOCUMENTS

| | | | |
|---|---|---|---|
| CN | 102719235 A | * | 10/2012 |
| CN | 103468263 A | | 12/2013 |
| JP | 0641527 A | | 2/1994 |
| JP | 20058844 | | 1/2005 |
| JP | 200850493 | | 3/2008 |
| JP | 201217454 A | | 1/2012 |
| JP | 2013127076 A | | 6/2013 |
| JP | 2013533359 A | | 8/2013 |
| JP | 2013254379 A | | 12/2013 |
| TW | 201120184 A | | 6/2011 |
| TW | 201321474 A1 | | 6/2013 |
| WO | 2010095737 A1 | | 8/2010 |
| WO | WO 2012084440 A1 * | 6/2012 | ............ C09K 11/02 |

OTHER PUBLICATIONS

English Abstract translation of JP20058844 (Published Jan. 13, 2005).
English Abstract translation of JP200850493 (Published Mar. 6, 2008).
TW Office Action dated Dec. 24, 2014 (TWA102148454).
TW Office Action dated Dec. 24, 2014 (TWA102148451).
English Abstract translation of TW201120184 (Published Jun. 16, 2011).
SIPO Office Action dated Jan. 18, 2016 in corresponding CN application (No. 201410116511.X).
JPO Office Action dated Jan. 5, 2016 in corresponding JP application (No. JP2014-259706).
JPO Office Action dated Jan. 5, 2016 in corresponding JP application (No. JP2014-259707).
Non-Final Office Action issued in U.S. Appl. No. 14/521,530, filed Oct. 23, 2014, dated Jan. 21, 2016.
SIPO Office Action dated Mar. 25, 2016 in Chinese application (No. 201410115447.3).
SIPO Office Action dated Jul. 29, 2016 in Chinese application (No. 201410116511.X).
JPO Office Action dated Sep. 26, 2016 in JP application (No. JP2014-259707).

* cited by examiner

PHOSPHOR, PREPARING METHOD FOR PHOSPHOR, AND LIGHT EMITTING DEVICE

This application claims the benefit of Taiwan application Serial No. 102148451, filed Dec. 26, 2013, the subject matter of which is incorporated herein by reference.

BACKGROUND

Technical Field

The disclosure relates in general to a phosphor and a preparing method for the phosphor, and particularly to a phosphor having a diameter distribution span less than 0.7, a preparing method for the phosphor, and a light emitting device using the same.

Description of the Related Art

In recent years, light emitting devices utilizing semiconductors for emitting lights have been intensively used. In particular, light emitting diodes (LED) have been developed successfully. Compared to conventional light emitting equipments, such as cold cathode fluorescent lamps and incandescent lamps, light emitting devices utilizing light emitting diodes have advantages of high emitting efficiency, small volumes, low power consumption, and low cost. Therefore, such light emitting devices are used in various light sources. Semiconductor light emitting devices comprise semiconductor light emitting elements and fluorescent materials. Fluorescent materials can absorb and convert lights emitted from semiconductor light emitting elements. Lights emitted directly from semiconductor light emitting elements and lights converted by fluorescent materials can be mixed for use. Such light emitting devices can be used in various areas, such as fluorescent lights, car lighting, display devices, and liquid crystal backlights.

Current white LED light emitting devices are developed according to anaglyphic principle. Fluorescent materials absorb a blue light emitted from semiconductor light emitting elements and convert it into a yellow light. When the blue light and the yellow light enter human eyes simultaneously, a white light is observed by the human. For example, the above-mentioned effect can be achieved via a semiconductor of InGaN and a yellow fluorescent material having a general formula of $(Y,Gd)_3(Al,Ga)_5O_{12}$:Ce.

Further, a white light can be generated by utilizing a combination of a light emitting element which emits ultraviolet lights and a fluorescent material which emits g RGB (red, green, and blue) lights. Furthermore, when a light emitting element emits an ultraviolet light, the ultraviolet light is converted by a fluorescent material to emit a blue light, and then another fluorescent material is excited by the blue light to emit a yellow light, as such, a white light is generated by mixing the blue light and the yellow light.

However, light emitting devices have been used in more and more areas, and the luminous brightness of the commercially yellow fluorescent material $(Y,Gd)_3(Al,Ga)_5O_{12}$:Ce series is evidently insufficient, therefore, the industrial needs are not satisfied. In addition, when luminous brightness is increased, luminescent chromaticity shift easily occurs. Therefore, developing a fluorescent material which satisfies the needs for various applications of light emitting devices as well as increases luminance has become one of the most important goals.

SUMMARY

The present disclosure relates to a phosphor, a preparing method for the phosphor, and a semiconductor light emitting element using a phosphor comprising the phosphor having an excellent light emitting characteristic such as high brightness.

According to an embodiment of the present disclosure, phosphor is disclosed. The phosphor comprises a formula of $A_{3-a}Ce_aQ_{5-e}E_eO_{12}$. The A, the Q and the E independently comprise elements aluminum (Al), gallium (Ga), indium (In), scandium (Sc), yttrium (Y), lanthanum (La), gadolinium (Gd), terbium (Tb), lutetium (Lu), or a combination thereof. Ce is cerium. O is oxygen. $0<a\le3$. $0\le e\le5$. A diameter distribution span of the phosphor is less than 0.7.

According to another embodiment of the present disclosure, a light emitting device is disclosed. The light emitting device comprises a semiconductor light emitting element and a phosphor. The phosphor comprises a formula of $A_{3-a}Ce_aQ_{5-e}E_eO_{12}$. The A, the Q and the E independently comprise elements aluminum (Al), gallium (Ga), indium (In), scandium (Sc), yttrium (Y), lanthanum (La), gadolinium (Gd), terbium (Tb), lutetium (Lu), or a combination thereof. Ce is cerium. O is oxygen. $0<a\le3$. $0\le e\le5$. A diameter distribution span of the phosphor is less than 0.7. The phosphor is excited by a light emitted from the semiconductor light emitting element and converts the light emitted from the semiconductor light emitting element to emit a light having a wavelength different from a wavelength of light emitted from the semiconductor light emitting element.

According to another embodiment of the present disclosure, a preparing method for a phosphor is disclosed. The method comprises following steps. A raw material mixture is sintered to obtain a sintered phosphor material. The sintered phosphor material is mixed with an alkali metal silicate aqueous solution to obtain a phosphor mixture. Then the phosphor mixture is subjected a subsequent treating process comprising a water-washing step to obtain the phosphor.

The above and other embodiments of the disclosure will become better understood with regard to the following detailed description of the non-limiting embodiment(s). The following description is made with reference to the accompanying drawings.

DETAILED DESCRIPTION

Figure 1:
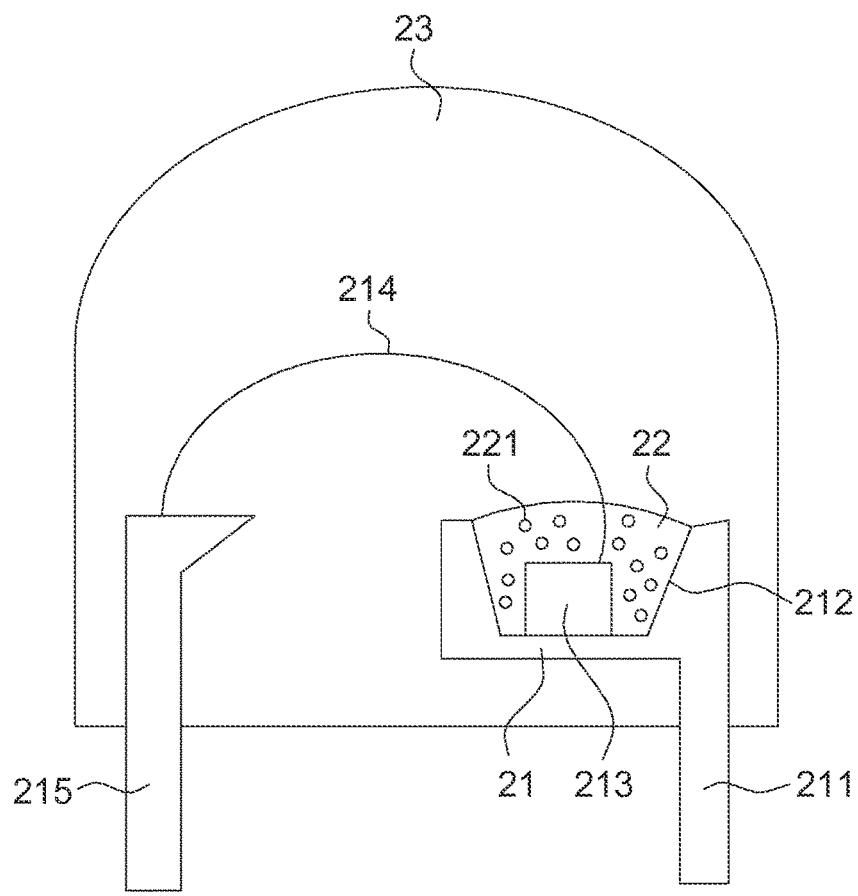
FIG. 1 shows a cross-sectional view of the light emitting device according to an embodiment of the present disclosure.

In embodiments, phosphor includes a composition of a formula $A_{3-a}Ce_aQ_{5-e}E_eO_{12}$. Ce is an element cerium. O is an element oxygen. Phosphor has a diameter distribution span (Span) less than 0.7. A phosphor complying with the above conditions has a notable improved luminous intensity. As compared with a phosphor not complying with the above conditions (comparative example), the phosphor of embodiment has a higher brightness.

In the present disclosure, the term "diameter distribution span" is defined as (D90−D10)/D50. The diameter D10 means that portions of the phosphor of 10% of the whole volume have a diameter less than or equal to the value of the diameter D10. The median diameter D50 means that portions of the phosphor of 50% of the whole volume have a diameter less than or equal to the value of the median diameter D50. The diameter D90 means that portions of the phosphor of 90% of the whole volume have a diameter less than or equal to the value of the diameter D90. The diameter distribution span, which is abbreviated as the term of "Span" in the present disclosure, can indicate a concentration degree of powder diameter. For example, the smaller value of the Span indicates the diameters of the powders more concentrate on the median diameter D50.

In embodiments, the phosphor has a composition of a formula of $A_{3-a}Ce_aQ_{5-e}E_eO_{12}$. Ce is an element cerium. O is an element oxygen. The Span of the phosphor prepared by a method according to embodiments is less than 0.7, preferably 0.40~0.69, and more preferably 0.60~0.69. As compared to the phosphor of larger Span (comparative example), the phosphor of embodiment have a higher luminous intensity.

In embodiments, as the median diameter (D50) of the phosphor is larger than 13 μm, a content of the phosphor larger than 20 μm is less than 5% of volume of the phosphor, such as less than 5% and more than 3% of volume of the phosphor.

In embodiments, as the median diameter (D50) of the phosphor is larger than 13 μm, a content of the phosphor in 10~20 μm is more than 80% of volume of the phosphor, such as more than 80% and less than 90% of volume of the phosphor.

In embodiments, as the median diameter (D50) of the phosphor is larger than 13 μm, a content of the phosphor less than 10 μm is less than 15% of volume of the phosphor, such as less than 15% and more than 10% of volume of the phosphor.

In embodiments, as the median diameter (D50) of the phosphor is less than 13 μm, a content of the phosphor in 10~15 μm is more than 50% of volume of the phosphor.

The A of the phosphor of $A_{3-a}Ce_aQ_{5-e}E_eO_{12}$ may comprise aluminum (Al), gallium (Ga), indium (In), scandium (Sc), yttrium (Y), lanthanun (La), gadolinium (Gd), terbium (Tb), lutetium (Lu), or a combination thereof. Preferably, the A comprises at least one of elements Y, La, Gd, Tb and Lu. In one embodiment, the A comprises element Y. The Q may comprise elements Al, Ga, In, Sc, Y, La, Gd, Lu, or a combination thereof. Preferably, the Q element comprises at least one of elements Ga and Al. In one embodiment, the Q comprises element Al. The E may comprise Al, Ga, In, Sc, Y, La, Gd, Lu elements, or a combination thereof. Preferably, the E element comprises at least one of Ga, In, Sc and Al elements. In embodiment, the E element comprises Al element.

In embodiments, the phosphor of $A_{3-a}Ce_aQ_{5-e}E_eO_{12}$ complies with: $0<a\le 3$, such as $0.03\le a\le 0.1$; and $0\le e\le 5$, such as $3\le e\le 5$.

The phosphor can be excited by a light of wavelength 455 nm to emit a light having a dominant wavelength of 520~580 nm, and CIE chromaticity coordinates (x, y) of $0.360\le x\le 0.460$ and $0.530\le y\le 0.580$. The dominant wavelength is the wavelength of the emitting light of the strongest luminous intensity.

According to embodiments, the phosphor may be prepared by a method comprising following steps. Phosphor raw materials and a fluxing agent are mixed to obtain a raw material mixture. Next, the raw material mixture is subjected to a sintering step to form a sintered phosphor material. The formed sintered phosphor material may be grinded. Then, the sintered phosphor material (or grinded sintered phosphor material) and an alkali metal silicate aqueous solution are mixed to obtain a phosphor mixture. The phosphor mixture is subjected to a treating process that may comprise a grinding step, a water-washing step, and/or (then) a drying step to obtain the phosphor.

In the method, the phosphor raw materials for the sintered phosphor material comprises source materials for each of the elements of the composition $A_{3-a}Ce_aQ_{5-e}E_eO_{12}$ of the phosphor, i.e. the source materials for the Ce element, the A element, the Q element, the E element, or a combination thereof. The A element may comprise Al, Ga, In, Sc, Y, La, Gd, Tb, Lu elements, or a combination thereof. Preferably, the A element comprises at least one of Y, La, Gd, Tb and Lu elements. In one embodiment, the A element comprises Y element. In another embodiment, the A element comprises Y element and Gd element. The Q element may comprise Al, Ga, In, Sc, Y, La, Gd, Lu elements, or a combination thereof. Preferably, the Q element comprises at least one of Ga and Al elements. In one embodiment, the Q element comprises Al element. The E element may comprise Al, Ga, In, Sc, Y, La, Gd, Lu elements, or a combination thereof. Preferably, the E element comprises at least one of Ga, In, Sc and Al elements. In one embodiment, the E element comprises Al element. The source materials for each of the elements in the phosphor raw materials may comprise an oxygen-containing compound, a nitrogen-containing compound or other kinds of compound, or elemental substances, or combinations thereof. The oxygen-containing compound may comprise an oxide, a carbonate, an oxalate, or other compounds, which can be decomposed during the sintering process. Proportion of the source materials may be selected according to mole ratio of every element of the expected $A_{3-a}Ce_aQ_{5-e}E_eO_{12}$ composition of the phosphor. In one embodiment, for example, the source material for the A element comprises $Y_2O_3$, or further comprises $Gd_2O_3$. The source material for the Ce element comprises $CeO_2$. The source material for the Q element comprises $Ga_2O_3$. The source material for the E element comprises $Al_2O_3$. The source material for the O element may comprise oxygen element from the source material for the A, Ce, Q, E elements etc, or oxygen element generated during the sintering step. However, the present disclosure is not limited thereto.

The fluxing agent for preparing the sintered phosphor material may comprise a compound containing a metal element. The metal element may comprise Na, K, Ba, Sr, Mg, Al, Y, or combinations thereof. For example, the fluxing agent may comprise a metal halide, such as NaF, KF, $BaF_2$, $BaF_3$, $SrF_2$, $MgF_2$, $AlF_3$, $YF_3$, NaCl, $BaCl_2$, etc, or combinations thereof. In one embodiment, the fluxing agent comprises $YF_3$.

In the preparing method for the sintered phosphor material, the mole ratio of the metal element of the fluxing agent:the A element of the phosphor raw materials:the Ce element of the phosphor raw materials:the Q element of the phosphor raw materials:the E element of the phosphor raw materials is equal to z:3−a:a:5−e:e. By that means, the formed phosphor, and the sintered phosphor material obtained from the phosphor mixture can have the composition having the formula of $A_{3-a}Ce_aQ_{5-e}E_eO_{12}$. In one embodiment, quantities of the elements of the raw material mixture or/and the sintered phosphor material or phosphor ($A_{3-a}Ce_aQ_{5-e}E_eO_{12}$ composition) may comply with conditions: $0.010\le z\le 0.016$; $0<a\le 3$, such as $0.03\le a\le 0.1$; and $0\le e\le 5$, such as $3\le e\le 5$.

The raw materials may be commercial products, and preferably have high purity for decreasing impurity that may affect luminous brightness of the phosphor products, such as higher than 2N (99%), preferably higher than 3N (99.9%).

Preferably, a particle size of each of the raw materials is designed to be micro size based on a viewpoint of promoting reaction.

Results from constituent analysis have found a slight deviation between the mole numbers (i.e. 3−a, a, 5−e, e, 12) of each of the elements of the $A_{3-a}Ce_aQ_{5-e}E_eO_{12}$ composition for the phosphor and the raw materials. It is supposed that the result is due to decomposition or evaporation of small quantity of the raw materials during sintering, or analytical inaccuracy. In particular, it is supposed that deviations in the value for the oxygen element is due to oxygen contained in the initial raw materials or adsorbed to the surfaces of the raw materials, or surface oxidation of the raw materials during weighing, mixing and sintering steps, or moisture, oxygen, etc., adsorbed to the surface of the sintered phosphor material after sintering. In addition, when the sintering step is performed in an environment containing nitrogen and/or ammonia gas, the oxygen contained in the raw materials might possibly separate therefrom and be replaced by a nitrogen element, and thus the slight deviations in the oxygen value of the sintered phosphor material (or phosphor) would occur.

The phosphor raw materials and the fluxing agent may be mixed together by a method comprising a dry process (such as dry ball milling) or a wet process (such as wet ball milling) and not restricted to a single type of process. The weighing, mixing steps, etc may be performed in a glove box under an inactive or dewatered environment. In addition, a proper organic solvent, such as pure water or an organic solvent, etc., may be used according to characteristics of the materials for the wet mixing method. A mixer device may use a ball mill, a mortar, or other common devices.

In the preparing method, the sintering step applied to the raw material mixture obtained by mixing the phosphor raw materials and the fluxing agent may be performed under an ambient atmospheric pressure or a condition compressed by gas, or other conditions without an external mechanical pressure. The high temperature furnace for the sintering can use a metal resistive heating type or a graphite resistive heating type preferably since a sintering temperature is high.

In the sintering step, a crucible for placing the raw material mixture therein preferably has a material of high degree of purity, that is, having an impurity of extreme small amount, such as a $Al_2O_3$ crucible, a $Si_3N_4$ crucible, a AlN crucible, a Sialon crucible, a boron nitride (BN) crucible, or other crucibles suitable for using in an inactive environment, in which the BN crucible is preferably since it can provide a good effect preventing an impurity of which from mixing into the materials. The crucible can be aluminum oxide, boron nitride, or graphite, and the materials chosen for the crucible is not limited to the materials aforementioned. A cover layer on an inner wall of the crucible may be formed by various materials during a high temperature sintering process. For example, one of the raw materials of the to-be-sintered raw material mixture can be used for forming the cover layer by the sintering step. The sintering condition for the cover layer can be 850° C.~1800° C. and 0.5~10 hours. When the sintering temperature is too low or the sintering time duration is too short, the effective cover layer may not be formed successfully. When the sintering time duration is too long or the sintering temperature is too high, a satisfying economic efficiency is not achieved. The cover layer can prevent impurities, such as Si and Ca, from being released from the crucible and entering the sintered phosphor material obtained by sintering the raw material mixture under a high temperature, hence influencing the property of the sintered phosphor material. The sintering atmosphere may be a non-oxidizing gas, such as nitrogen, hydrogen, ammonia, argon, or an arbitrary combination of the above-mentioned gases.

The sintering temperature is 1000° C.~1800° C., preferably 1100° C.~1600° C. The heating rate is 5~15° C./min. The sintered phosphor material can be prepared as having a less particle size by using a lower sintering temperature, or having a larger particle size by using a higher sintering temperature. The sintering time may be controlled according to types of the raw materials, usually 1~12 hours, preferably 1.5~5 hours. A sintering pressure of the inactive environment may be, for example, equal to or lower than 0.5 MPa, particularly equal to or lower than 0.1 MPa preferably. The sintering process is not limited to perform only one time, and may be performed more than one times. Under the sintering atmosphere, multiple sintering process allow the raw materials of the raw material mixture to enter into sites of crystal lattices thereby replacing and removing the impurities, so as to control the content of impurities in the sintered phosphor material to improve the light emitting property and stability of the sintered phosphor material.

After the sintering step, the sintered phosphor material may be further cooled to a room temperature, pulverized by using the ball mill or a pulverizer, etc.

The alkali metal silicate aqueous solution for mixing with the sintered phosphor material (or grinded sintered phosphor material) for obtaining the phosphor mixture comprises a water glass-water solution, such as a water solvent having 1.5~5 wt % of a water glass as a solute dissolved therein, and in one embodiment a water solution having 2 wt % of the water glass. In embodiments, the water solution containing the water glass of the above range can be used for preparing the phosphor having the Span less than 0.7, and thus having a higher brightness value.

The water glass is a water soluble material formed by integrating an alkali metal oxide and silicon dioxide. According to types of the alkali metal, the water glass comprises a sodium water glass having a molecular formula of $Na_2O.nSiO_2$, and a potassium water glass having a molecular formula of $K_2O.nSiO_2$. The coefficient of n in the molecular formula is referred to as water glass modulus, indicating a molecular ratio (or mole ratio) of the silicon oxide and the alkali metal oxide in the water glass. n may be 1.5~4.0, preferably 2.0~3.5.

The subsequent treating process for obtaining the phosphor comprises subjecting the mixture of the sintered phosphor material and the alkali metal silicate aqueous solution to a water-washing step, a filtering step, and/or a drying step, or other steps such as a classing step, performed once or more times. In embodiments, subsequent treating process, like the water-washing step, can decreasing (or removing) impurities and improving light emitting characteristics of the phosphor.

In embodiments, the phosphor mixture obtained by mixing the sintered phosphor material and the alkali metal silicate aqueous solution may be grinded by a ball mill or other suitable methods, and washed by water, filtered, or/and dried to form the phosphor. The subsequent treating process are not limited to only one time, and may be performed for a plurality of times.

In embodiments, the alkali metal silicate aqueous solution in the phosphor mixture is used as a dispersing agent for improving dispersing of the sintered phosphor material during the grinding process, decreasing a secondary particle proportion, for example dispersing larger agglomerated particles into smaller ones. Undersize particles would suspend easily, and thus can be removed by a water washing step.

Therefore, the phosphor has low Span can be obtained. In other words, particle diameter distribution of the phosphor is more concentrated. Thus the phosphor has an excellent luminous brightness. A lower Span value also means a smaller quantity of under size or over size particles disadvantaging the luminous brightness. The luminous brightness is mainly dominated by emitting from surfaces of the phosphor particle. The smaller particles of phosphor have poorer emitting capability. For example, brightness generated by particles smaller than 9 μm is only 80% of brightness generated by particles of 14 μm. Although oversize particles have higher light emitting capability, brightness of which is reduced due to shielding effect. With trade-offs of the two factors, particles having more concentrated diameter distribution have higher brightness.

In embodiments, as the mole of the metal element of the fluxing agent in the raw material mixture is controlled to be as z larger than 0.013 (for example 0.013<z≤0.016), the median diameter D50 of the prepared phosphor is larger than 13 μm, wherein portions of the phosphor having a diameter larger than 20 μm occupy less than 5% (<5%) of volume of the whole phosphor, portions of the phosphor having a diameter of 10~20 μm occupy more than 80% (>80%) of volume of the whole phosphor, portions of the phosphor having a diameter smaller than 10 μm occupy less than 15% (<15%) of volume of the whole phosphor.

In embodiments, as the mole of the metal element of the fluxing agent in the raw material mixture is controlled to be as z less than 0.013 (for example 0.010≤z<0.013), the median diameter D50 of the prepared phosphor is smaller than 13 μm, wherein portions of the phosphor having a diameter of 10-15 μm occupy more than 50% (>50%) of volume of the whole phosphor.

In the preparing processes, impurities that would affect luminous brightness of the sintered phosphor material or phosphor should be controlled as low as possible. For example, elements boron, chlorine, carbon, etc may be less than 1000 ppm, respectively.

The phosphor of the present invention is applicable to vacuum fluorescent displays (VFD), field emission displays (FED), plasma display panels (PDP), cathode ray tubes (CRT), light emitting diodes (LED), and etc. Particularly, the phosphor has high luminous brightness, thus are suitable for the light emitting diodes.

In an embodiment, a light emitting device includes a light emitting element and the phosphor described above. The phosphor is excited by a light emitted from the light emitting element and convert the light emitted from the light emitting element to emit a light having a wavelength different from the wavelength of the exciting light.

The light emitting element may be a semiconductor light emitting element, such as semiconductors comprising zinc sulfide, gallium nitride, etc. In view of illumination efficiency, using a semiconductor of gallium nitride is preferable. The light emitting element is manufactured by forming a nitride semiconductor on a substrate by a metal organic chemical vapor deposition (MOCVD) or a hydride vapor phase epitaxy (HVPE). The light emitting element made of $In_\alpha Al_\beta Ga_{1-\alpha-\beta} N$ ($0 \leq \alpha$, $0 \leq \beta$, $\alpha+\beta<1$) is the most preferable.

The semiconductor structure may be a homogeneous structure, such as metal-insulator semiconductor (MIS), PIN linkage, and PN linkage, a heterojunction structure, or a double heterojunction structure. The wavelength of the emitting light may be decided according to the materials of the semiconductor layer or the mixed crystal level. Preferably, the light emitted from the light emitting element of the light emitting device is 300 nm~550 nm, and more preferably 330~500 nm. The phosphor according to the embodiments of the invention can be mixed with a transparent material to form a wavelength conversion material. The transparent material may be epoxy, silicone resin, glass, thermoplastics, and etc., which lights can pass through. The wavelength conversion material comprises at least a single layer wavelength conversion material formed with the phosphor or a laminated multilayer wavelength conversion material formed with the phosphor. The wavelength conversion material is disposed on the illumination path on the semiconductor light emitting element. For example, the wavelength conversion material is coated directly on the surface of the light emitting element, the wavelength conversion material is made into a mold which covers the light emitting element as an encapsulation, the wavelength conversion material is formed on the surface of an encapsulation, or the wavelength conversion material is formed on an optical plate or an optical film and arranged in front of the projecting side of the LED light.

FIG. 1 shows a cross-sectional view of the light emitting device according to an embodiment of the present disclosure. The light emitting device comprises a light emitting unit 21, a phosphor layer 22, and an encapsulating layer 23.

The light emitting unit 21 comprises a conductive base 211 having a concave bearing surface 212, a light emitting element 213 disposed in the concave bearing surface 212 and electrically connected to the base 211, a connecting wire 214 electrically connected to the light emitting element 213, a conducting wire 215 electrically connected to the connecting wire 214. The base 211 and the conducting wire 215 can cooperate to supply external electrical energy to the light emitting element 213. The light emitting element 213 can convert the electrical energy to light energy and emit it out. An example of the invention is to adhere a commercial available InGaN light emitting element 213 (Chi Mei Lighting Technology Corp.) of light emitting wavelength of 455 nm on the concave bearing surface 212 of the base 211 with a conductive silver paste (BQ6886, Uninwell International), and then the connecting wire 214 electrically connected to the light emitting element 213 and the conducting wire 215 are extended from the top surface of the light emitting element 213.

The phosphor layer 22 covers the light emitting element 213. After the phosphor 221 contained in the phosphor layer 22 are excited by the light emitted from the light emitting element 213, the phosphor 221 converts the light emitted from the light emitting element 213 to emit a light having a wavelength different from the wavelength of the exciting light. In the example, the phosphor layer 22 is formed by coating a polysiloxane resin with the phosphor 221 contained therein on the external surface of the light emitting element 213 followed by drying and hardening.

The encapsulating layer 23 covers a part of the base 211 of the light emitting unit 21, connecting wire 214, a part of the conducting wire 215, and the phosphor layer 22.

In the light emitting device of the invention, the phosphor of the invention can either be used independently or by cooperating with phosphor of other light emitting characteristics, such that a light emitting device capable of emitting desired colors of light is constructed.

For example, a blue light emitting element of 420~500 nm, red phosphor emitting light of 600~650 nm (such as $CaAlSiN_3$:Eu), and the phosphor for emitting yellow light of the invention are assembled to manufacture a light emitting device. Red light and yellow light will be emitted respectively when the phosphor is illuminated by the blue light emitted from the light emitting element, and the lights will be mixed with the blue light emitted from the light emitting element to become a white light emitting device (such as a light apparatus, a light emitting diode, and etc.)

Experimental Example

Figure 2:
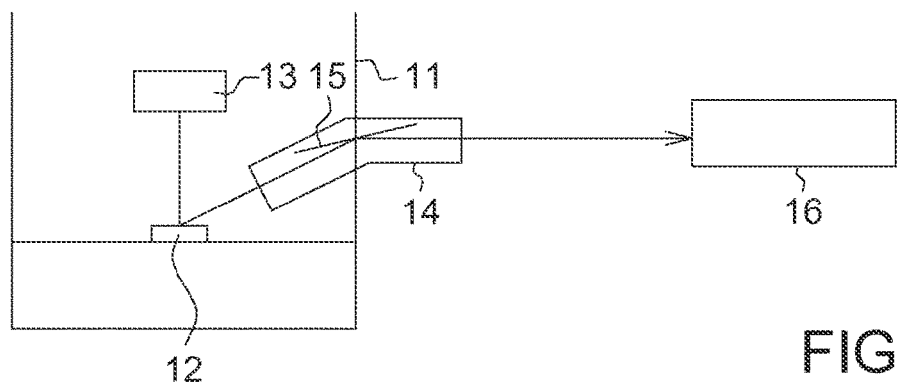
FIG. 2 shows the measurement apparatus of the characteristics of the light emitted from the fluorescent material.

Experimental examples are illustrated as following.
Measurement Methods:
(1) Analysis for the diameter (D10, D50, D90) of the phosphor is measured by the Beckman Coulter Multisizer-3.
(2) Luminescence Spectrum of the Phosphor:
The measurement apparatus of the characteristics of the light emitted from the phosphor is as shown in FIG. 2. The measurement is carried out as follows. 1.8 grams of sample is taken into a sample holder 12 having a diameter of 12 cm and pressed so that the sample is uniformly distributed in the sample holder 12. The sample holder 12 is then placed inside a black box body 11. A light source 13 of wavelength of 455 nm, such as an InGaN blue light emitting diode element having a silicon carbide substrate, is disposed vertically above the sample with a distance of 5 cm away from the sample. The sample is irradiated with the light source 13. The fluorescent light is directed horizontally into a brightness meter 16 (TOPCON, SR-3A) via a reflective mirror 15. The reflective mirror 15 is disposed in a light guide tube 14 having a diameter of 2 cm and directs the fluorescent light emitted from the fluorescent material. The light guide tube 14 and the light source form an angle of 45°. The distance between the reflective mirror 15 and the sample holder 12 is 8 cm, and the distance between the brightness meter 16 and the reflective mirror 15 is 40 cm. The brightness meter 16 applies a field 1° detection mode. Measurement inaccuracy in brightness value is within ±0.3%. Main wavelength of light from the phosphor was measured by Fluoro Max-3 of Jobin YVON.
(3) Composition Element Analysis of Phosphor:
(3-1a) Instrument: The measurement was carried out with inductively coupled plasma atomic emission spectrometer (ICP) (ULTIMA-2 type, Jobin Yvon Technology).
(3-1b) Pretreatments of sample(s): A sample of 0.1 gram was accurately weighed and taken to place in a platinum crucible. 1 gram of $Na_2CO_3$ was added into the platinum crucible, and mixed with the sample uniformly. Then, the mixture was fused by a high temperature furnace in 1200° C. (temperature condition: temperature was raised from the room temperature to 1200° C. in 2 hours and stayed at 1200° C. for 5 hours). The fusion product was then cooled and added into an acid solution, such as 25 ml HCl (36%), and then heated to be dissolved until the solution was clear. The solution was then placed into a 100 mL PFA volumetric flask after being cooled and quantitatively added with pure water to the marked line of the flask.
(3-2a) Instrument: Nitrogen and Oxygen analyzer (Horiba Ltd., EMGA-620W).
(3-2b) Measurement: 20 mg of the phosphor was placed into a Sn capsule, and then the capsule was placed in a crucible to be measured.

Embodiment and Comparative Example

The phosphors of embodiments and comparative examples are prepared by similar methods except the differences shown in tables 1 to 3. Table 1 shows mole relation of each element of the phosphor raw materials of the raw material mixture, i.e. mole relation of each element of the formula $A_{3-a}Ce_aQ_{5-e}E_eO_{12}$ and the metal element yttrium (Y) of the fluxing agent $YF_3$ of the raw material mixture, wherein the element A in the formula is element yttrium (Y) and element gadolinium (Gd), the element Q is element gallium (Ga), the element E is element aluminum (Al). Table 2 and table 3 show concentrations of the water glass solutions. The preparing method for the phosphors is disclosed by taking embodiment 3 as an example as following. In embodiment 3, the phosphor raw materials of $Y_2O_3$ (CHANGSHU SHENGCHANG Co., Ltd.; 99.9%), $Al_2O_3$ (Sumitomo Chemical Co., Ltd.; 99.99%), $Ga_2O_3$ (Chinalco Henan Aluminum Co., Ltd.; 99.99%), $CeO_2$ (Shanghai Yuelong New Materials Co., Ltd.; 99.9%) and the fluxing agent of $YF_3$ (Junlian Technology and Industry Co., Ltd.; 99.99%) were mixed to obtain the raw material mixture. Quantity of each of the raw materials was decided according to the raw material mixture to comply with the conditions shown in table 1, i.e. $A_{3-a}Ce_aQ_{5-e}E_eO_{12}$, a=0.05, e=3.45, and z=0.016, wherein z indicates the content of the element Y of the fluxing agent. Embodiments 7, 8, 10 containing element Gd use $Gd_2O_3$ (Sigma-Aldrich, purity of 4N) for the phosphor raw materials.

10 g of the raw material mixture and 20 g~30 g of pure water were mixed uniformly, and then coated on the inner wall of the 500 ml aluminum oxide crucible. The crucible was heated in the high temperature furnace under the nitrogen gas atmosphere by increasing the temperature from the room temperature slowly to 1500° C. and maintaining the constant temperature 1500° C. for about 4 hours to perform the sintering step, and then cooled down to the room temperature slowly to form the cover layer on the inner wall of the crucible. After placing the raw material mixture in the crucible having cover layer on the inner wall, the crucible was again heated in the high temperature furnace under the environment of nitrogen gas of 95% of volume and hydrogen gas of 5% of volume by increasing the temperature from the room temperature slowly to 1200° C. and maintaining the constant temperature 1200° C. for about 2 hours to perform the sintering step, and then cooled down to the room temperature. The product was then grinded, ball milled, washed by water twice, filtered, dried, classified, etc., and then again heated in the high temperature furnace under the environment of nitrogen gas of 95% of volume and hydrogen gas of 5% of volume by increasing the temperature from the room temperature slowly to 1500° C. and maintaining the constant temperature 1500° C. for about 4 hours to perform the sintering step, and then cooled down to the room temperature, so as to obtain the sintered phosphor material. The 2 wt % water glass solution was prepared by mixing the purchase 28 wt % water glass solution (purchased from Wako Pure Chemical Industries; $SiO_2/Na_2O$ of the mole ratio 3.4~4) with water. The phosphor mixture was obtained by mixing the prepared 2 wt % water glass solution with the sintered phosphor material (100 g of the sintered phosphor material with 100 ml of the water glass-water solution). After the container with the phosphor mixture wherein was rolled in the ball mill for 6 hours, the mixture was taken out from the rolled. The mixture was washed by water four times, dried, classified, etc to obtain the phosphor.

TABLE 1 more relation of element of raw material mixture

| | phosphor raw materials | | | | | fluxing agent |
|---|---|---|---|---|---|---|
| | Ce | Y | Ga | Al | Gd | Y |
| Embodiment 1 | 0.05 | 2.95 | 1.55 | 3.45 | 0 | 0.016 |
| Embodiment 2 | 0.052 | 2.948 | 1.56 | 3.44 | 0 | 0.014 |
| Embodiment 3 | 0.048 | 2.952 | 1.51 | 3.49 | 0 | 0.016 |
| Comparative example 1 | 0.05 | 2.95 | 1.55 | 3.45 | 0 | 0.016 |

TABLE 1-continued more relation of element of raw material mixture

| | phosphor raw materials | | | | | fluxing agent |
|---|---|---|---|---|---|---|
| | Ce | Y | Ga | Al | Gd | Y |
| Comparative example 2 | 0.052 | 2.948 | 1.56 | 3.44 | 0 | 0.014 |
| Comparative example 3 | 0.048 | 2.952 | 1.51 | 3.49 | 0 | 0.016 |
| Comparative example 4 | 0.041 | 2.959 | 1.33 | 3.67 | 0 | 0.014 |
| Comparative example 5 | 0.037 | 2.963 | 1.30 | 3.70 | 0 | 0.015 |
| Embodiment 4 | 0.038 | 2.962 | 1.65 | 3.35 | 0 | 0.011 |
| Embodiment 5 | 0.035 | 2.95 | 1.63 | 3.37 | 0 | 0.010 |
| Comparative example 6 | 0.038 | 2.962 | 1.65 | 3.35 | 0 | 0.011 |
| Comparative example 7 | 0.035 | 2.95 | 1.63 | 3.37 | 0 | 0.009 |
| Embodiment 6 | 0.030 | 2.97 | 2.00 | 3.00 | 0 | 0.016 |
| Embodiment 7 | 0.10 | 2.70 | 0.00 | 5.00 | 0.20 | 0.015 |
| Embodiment 8 | 0.05 | 1.45 | 0.00 | 5.00 | 1.50 | 0.015 |
| Embodiment 9 | 0.030 | 2.97 | 2.00 | 3.00 | 0 | 0.011 |
| Embodiment 10 | 0.10 | 2.70 | 0.00 | 5.00 | 0.20 | 0.010 |

Table 2 and table 3 list the concentrations of the water glass solutions for preparing the phosphor; the luminous intensities of the phosphor; diameters D10, D50, D90; the results of diameter distribution span (Span). The luminous intensities in table 2 are calculated based on the value of comparative example 5 as standard of 100%. The luminous intensities in table 3 are calculated based on the value of comparative example 7 as standard of 100%. The volume percentage of different diameter particles are shown in table 4 and table 5.

TABLE 2

| | water glass solution | luminous intensity | D10 | D50 | D90 | Span |
|---|---|---|---|---|---|---|
| Embodiment 1 | 2 wt % | 110% | 9.52 | 13.87 | 17.97 | 0.61 |
| Embodiment 2 | 2 wt % | 108% | 9.85 | 14.86 | 19.65 | 0.66 |
| Embodiment 3 | 2 wt % | 109% | 9.76 | 13.96 | 19.54 | 0.70 |
| Comparative example 1 | 1 wt % | 105% | 7.58 | 14.16 | 18.62 | 0.78 |
| Comparative example 2 | 0 wt % | 102% | 6.23 | 14.5 | 20.29 | 0.97 |
| Comparative example 3 | 0 wt % | 103% | 7.12 | 14.45 | 19.69 | 0.87 |
| Comparative example 4 | 0 wt % | 102% | 8.56 | 13.39 | 19.27 | 0.80 |
| Comparative example 5 | 0 wt % | 100% | 6.37 | 13.82 | 20.46 | 1.02 |
| Embodiment 6 | 2 wt % | 106% | 9.34 | 14.55 | 18.83 | 0.65 |
| Embodiment 7 | 2 wt % | 107% | 8.85 | 13.96 | 18.25 | 0.67 |
| Embodiment 8 | 2 wt % | 105% | 8.77 | 14.02 | 18.16 | 0.67 |

TABLE 3

| | water glass solution | luminous intensity | D10 | D50 | D90 | Span |
|---|---|---|---|---|---|---|
| Embodiment 4 | 2% | 107% | 8.34 | 12.19 | 16.58 | 0.67 |
| Embodiment 5 | 2% | 106% | 8.09 | 11.96 | 16.06 | 0.66 |
| Comparative example 6 | 0.2% | 102% | 7.61 | 11.44 | 16.79 | 0.80 |
| Comparative example 7 | 0.5% | 100% | 6.32 | 11.71 | 18.96 | 1.08 |
| Embodiment 9 | 2% | 106% | 8.11 | 11.74 | 16.09 | 0.68 |
| Embodiment 10 | 2% | 105% | 7.95 | 11.51 | 15.66 | 0.67 |

TABLE 4 volume percentage of different diameter particles, unit: %

| | 0~10 μm | 10~15 μm | 15~20 μm | 20~40 μm | 10~20 μm |
|---|---|---|---|---|---|
| Embodiment 1 | 14.03 | 51.64 | 32.37 | 1.96 | 84.01 |
| Embodiment 2 | 11.46 | 41.62 | 42.42 | 4.50 | 84.04 |
| Embodiment 3 | 12.84 | 48.39 | 33.90 | 4.87 | 82.29 |
| comparative example 1 | 21.33 | 38.69 | 36.20 | 3.78 | 74.89 |
| Comparative example 2 | 27.28 | 27.12 | 35.54 | 10.06 | 62.66 |
| Comparative example 3 | 22.90 | 32.71 | 38.20 | 6.19 | 70.91 |
| Comparative example 4 | 31.88 | 25.67 | 31.96 | 10.49 | 57.63 |
| Comparative example 5 | 30.55 | 32.75 | 29.43 | 7.27 | 62.18 |
| Embodiment 6 | 12.10 | 47.55 | 34.77 | 5.58 | 82.32 |
| Embodiment 7 | 9.85 | 43.68 | 37.88 | 8.59 | 81.56 |
| Embodiment 8 | 10.34 | 45.12 | 37.69 | 6.85 | 82.81 |

TABLE 5 volume percent of different diameter particles, unit: %

| | 0~5 μm | 5~10 μm | 10~15 μm | 15~20 μm |
|---|---|---|---|---|
| Embodiment 4 | 0.24 | 30.18 | 51.70 | 17.88 |
| Embodiment 5 | 0.21 | 28.86 | 52.80 | 18.13 |
| Comparative example 6 | 1.07 | 35.45 | 44.96 | 18.52 |
| Comparative example 7 | 2.71 | 35.66 | 34.92 | 26.71 |
| Embodiment 9 | 0.28 | 31.02 | 51.23 | 17.47 |
| Embodiment 10 | 0.25 | 29.45 | 53.11 | 17.19 |

From the results shown in table 2 and table 3, it is found that the luminous intensities of embodiments using the 2 wt % water glass solution are higher than the luminous intensities of comparative examples using the water glass solution of lower concentration or without using the water glass solution.

From the results shown in table 2 and table 3, it is found the Span values are decreased, in other words the particle diameter distribution is concentrated, when using the water glass solution during the ball mill process. It is because that during the grinding process, the water glass functions as the dispersing agent for the phosphor mixture to improve dispersing the phosphor mixture, decreasing a secondary particle proportion, for example dispersing larger agglomerated particles into smaller ones. With the effect from the water glass dispersing agent, small particles would suspend easily, and thus can be removed by a water washing step easily. Therefore the results show a trend of increasing of the D10 and decreasing of the D90 as the concentration of the water glass is increased. The increased degree of the D10 is more significant than the decreased degree of the D90. Thus, the Span values are decreased.

The luminous intensity of the phosphor is decreased as having the decreased diameter particles. In other words, the smaller particles have the poorer light emitting capability. In particular, luminous intensity generated by particles less than 9 μm is only 80% of luminous intensity generated by particles of 14 μm. Therefore, the luminous intensity of emitting light of the whole phosphor can be raised as the phosphor has less small particles. Although oversize particles have higher light emitting capability, brightness of which is reduced due to shielding effect as disadvantage effect. With trade-offs of the two factors, the phosphor has higher brightness when the diameter distribution is more concentrated.

As observed in table 2 and table 4, with regard to embodiments, as the median diameter (D50) of the phosphor is larger than 13 μm, portions of the phosphor having a diameter larger than 20 μm occupy less than 5% (<5%) of volume of the phosphor; portions of the phosphor having a diameter of 10-20 μm occupy more than 80% (>80%) of volume of the phosphor; portions of the phosphor having a diameter smaller than 10 μm occupy less than 15% (<15%) of volume of the phosphor. Accordingly, the phosphor has higher luminous intensity as having more concentrated diameter distribution.

As observed in table 3 and table 5, with regard to embodiments, as the median diameter D50 of the phosphor is less than 13 μm, portions of the phosphor having a diameter of 10-15 μm occupy more than 50% (>50%) of volume of the phosphor. Accordingly, the phosphor has higher luminous intensity as having more concentrated diameter distribution.

From the results shown in table 1, table 2 and table 3, during the preparing processes, as the content of the fluxing agent $YF_3$ (i.e. the z value) in the raw material mixture is more than 0.013, the phosphor having the median diameter D50 greater than 13 μm is obtained; as the z value is smaller than 0.013, the phosphor having the median diameter D50 less than 13 μm is prepared.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A preparing method for a phosphor, comprising:
sintering a raw material mixture to obtain a sintered phosphor material, mixing the sintered phosphor material with an alkali metal silicate aqueous solution to obtain a phosphor mixture, grinding the phosphor mixture, and then subjecting the ground phosphor mixture containing the alkali metal silicate aqueous solution to a water-washing step to remove suspended particles, and drying the washed phosphor mixture, wherein the alkali metal silicate aqueous solution consists essentially of 1.5-2 wt % of a water glass, the water glass consists essentially of alkali metal oxide and silicon oxide, wherein a numerical value of the sintered phosphor material based on a weight unit "g" is substantially the same as a numerical value of the alkali metal silicate aqueous solution based on a volume unit "ml", the phosphor consists essentially of a formula of $A_{3-a}Ce_aQ_{5-e}Al_eO_{12}$, wherein the A consists essentially of yttrium (Y), lanthanum (La), gadolinium (Gd), terbium (Tb), lutetium (Lu), or a combination thereof, $0<a\leq3$, $3\leq e<5$, and a diameter distribution span of the phosphor is less than 0.7.

2. The preparing method for the phosphor according to claim 1, wherein the alkali metal oxide comprises an alkali metal of Na, K, or a combination thereof.

3. The preparing method for the phosphor according to claim 1, wherein the alkali metal oxide comprises $Na_2O$, $K_2O$, or a combination thereof.

4. The preparing method for the phosphor according to claim 1, wherein the water glass have a molecular formula of $Na_2O.nSiO_2$ or a molecular formula of $K_2O.nSiO_2$, the coefficient of n is 1.5~4.0.

5. The preparing method for the phosphor according to claim 4, wherein in the molecular formula of $Na_2O.nSiO_2$ or the molecular formula of $K_2O.nSiO_2$, the coefficient of n is 2.0~3.5.

6. The preparing method for the phosphor according to claim 1, wherein $0.03\leq a\leq0.1$.

7. The preparing method for the phosphor according to claim 1, wherein as a median diameter (D50) of the phosphor is larger than 13 μm, a content of the phosphor larger than 20 μm is less than 5% of volume of the phosphor.

8. The preparing method for the phosphor according to claim 1, wherein as a median diameter (D50) of the phosphor is larger than 13 μm, a content of the phosphor larger than 20 μm is less than 5% and more than 3% of volume of the phosphor.

9. The preparing method for the phosphor according to claim 1, wherein as a median diameter (D50) of the phosphor is larger than 13 μm, a content of the phosphor in 10~20 μm is more than 80% of volume of the phosphor.

10. The preparing method for the phosphor according to claim 1, wherein as a median diameter (D50) of the phosphor is larger than 13 μm, a content of the phosphor in 10~20 μm is more than 80% and less than 90% of volume of the phosphor.

11. The preparing method for the phosphor according to claim 1, wherein as a median diameter (D50) of the phosphor is larger than 13 μm, a content of the phosphor less than 10 μm is less than 15% of volume of the phosphor.

12. The preparing method for the phosphor according to claim 1, wherein as a median diameter (D50) of the phosphor is larger than 13 μm, a content of the phosphor less than 10 μm is less than 15% and more than 10% of volume of the phosphor.

13. The preparing method for the phosphor according to claim 1, as a median diameter (D50) of the phosphor is less than 13 μm, a content of the phosphor in 10~15 μm is more than 50% of volume of the phosphor.

14. The preparing method for the phosphor according to claim 1, wherein the alkali metal silicate aqueous solution consists essentially of a water solvent and 1.5-2 wt % of the water glass as a solute dissolved in the water solvent.

15. The preparing method for the phosphor according to claim 13, wherein the water glass have a molecular formula of $Na_2O.nSiO_2$ or a molecular formula of $K_2O.nSiO_2$, the coefficient of n is 1.5~4.0.

16. The preparing method for the phosphor according to claim 15, wherein in the molecular formula of $Na_2O.nSiO_2$ or the molecular formula of $K_2O.nSiO_2$, the coefficient of n is 2.0~3.5.

17. The preparing method for the phosphor according to claim 13, wherein $0.03\leq a\leq0.1$.

18. The preparing method for the phosphor according to claim 13, wherein the alkali metal silicate aqueous solution consists essentially of a water solvent and 1.5-2 wt % of the water glass as a solute dissolved in the water solvent.

* * * * *